United States Patent
Bertuzzi et al.

(10) Patent No.: US 9,537,348 B2
(45) Date of Patent: Jan. 3, 2017

(54) STATIC TRANSFER SWITCH

(71) Applicant: Chloride Srl, Castel Guelfo (IT)

(72) Inventors: Giancarlo Bertuzzi, Calderara di Reno (IT); Graziano Galuppi, Imola (IT); Ugo Cinti, Calderara di Reno (IT)

(73) Assignee: Chloride Srl, Castel Guelfo (IT)

( * ) Notice: Subject to any disclaimer, the term of this patent is extended or adjusted under 35 U.S.C. 154(b) by 554 days.

(21) Appl. No.: 13/804,424

(22) Filed: Mar. 14, 2013

(65) Prior Publication Data

US 2014/0097689 A1   Apr. 10, 2014

Related U.S. Application Data

(60) Provisional application No. 61/700,917, filed on Sep. 14, 2012.

(51) Int. Cl.
*H02J 9/04* (2006.01)
*H03K 17/18* (2006.01)
*H03K 17/725* (2006.01)
*H03K 17/735* (2006.01)

(52) U.S. Cl.
CPC ............ *H02J 9/04* (2013.01); *H03K 17/18* (2013.01); *H03K 17/725* (2013.01); *H03K 17/735* (2013.01); *Y10T 307/615* (2015.04); *Y10T 307/76* (2015.04)

(58) Field of Classification Search
CPC ........ H02J 9/04; H03K 17/735; H03K 17/725; H03K 17/18; Y10T 307/615; Y10T 307/76
USPC ........................................ 307/64, 115, 125
See application file for complete search history.

(56) References Cited

U.S. PATENT DOCUMENTS

| | | | | |
|---|---|---|---|---|
| 3,942,028 A | * | 3/1976 | Baker | H02J 9/06 307/66 |
| 3,986,098 A | * | 10/1976 | Tamii | H02M 7/757 307/64 |
| 4,696,280 A | * | 9/1987 | Niggemeyer | F02P 15/12 123/598 |
| 5,814,904 A | * | 9/1998 | Galm | H02J 3/38 307/130 |
| 6,295,215 B1 | * | 9/2001 | Faria | H02J 9/062 363/124 |

(Continued)

FOREIGN PATENT DOCUMENTS

EP      0472902 A2   3/1992

OTHER PUBLICATIONS

Notification of International Search Report and Written Opinion of the International Searching Authority for PCT/IB2013/058549, mailed Sep. 29, 2014.

*Primary Examiner* — Jared Fureman
*Assistant Examiner* — Michael Warmflash
(74) *Attorney, Agent, or Firm* — Harness, Dickey & Pierce, P.L.C.

(57) ABSTRACT

A static transfer switch is used for switching an output load from a first power source to a second power source. A first switching unit has a first pair of silicon controlled rectifiers (SCR). A second switching unit has a second pair of SCRs arranged in an anti-parallel configuration. The control circuit determines whether at least one of the SCRs is activated in accordance with the voltage between the gate and the cathode of the at least one SCR. If the voltage between the gate in the cathode is at least 150 mV, the control circuit indicates that the at least one of the SCR is activated.

9 Claims, 6 Drawing Sheets

(56) References Cited

U.S. PATENT DOCUMENTS

2002/0011752 A1* 1/2002 Powell .................... H02J 9/062
　　　　　　　　　　　　　　　　　　　307/64
2009/0128218 A1* 5/2009 Yuan .................... H03K 17/725
　　　　　　　　　　　　　　　　　　　327/428

* cited by examiner

STATIC TRANSFER SWITCH

CROSS-REFERENCE TO RELATED APPLICATIONS

This application claims the benefit of U.S. Provisional Application No. 61/700,917, filed on Sep. 14, 2012. The entire disclosure of the above application is incorporated herein by reference.

FIELD

The present disclosure relates to Static Transfer Switch STS or uninterruptible power supply systems (UPS systems) having a static transfer switch.

BACKGROUND

This section provides background information related to the present disclosure which is not necessarily prior art.

The silicon controlled rectifier (SCR), which is a type of thyristor, is a widely used electronic component that can be easily controlled at start up, but its fast switch off detection is often difficult. Traditional ways of detecting the switch off detection of SCRs impose a number of limitations in performance in many applications where SCR are used, particularly in static transfer switches such as are used in UPS systems.

Typically, SCR switch off detection is mainly based on direct current analysis of the SCR. That is, the current flowing through the SCR is monitored and the SCR is determined to have switched off when the current flowing through it has dropped below a threshold, which is the holding current level of the SCR. However, SCRs having high amperage capacity in the thousands of amps can have a holding current level of only a few tens of milliamps. This presents difficulties and uncertainty when attempting to monitor the current flowing through the SCR and determining that this current has fallen below the holding current level of a few tens of milliamps. Considering a static transfer switch (STS) application, the sole direct current SCR switch off detection is not sufficient to guarantee a safe and fast transfer between the input sources. Consequently, the direct current analysis must be accompanied with other analysis (input voltage analysis, phase displacement analysis between voltage and current linked to the output load power factor, etc.). This additional analysis both requires significant additional CPU resources and results in delays in the transfer between sources depending on the particular working conditions of the STS.

SUMMARY

This section provides a general summary of the disclosure, and is not a comprehensive disclosure of its full scope or all of its features.

A static transfer switch to transfer an output load from a first power source to a second power source. The static transfer switch includes a first switching unit having a first silicon controlled rectifier (SCR) and a second switching unit having a second SCR. A control circuit determines whether at least one of the first SCR or the second SCR is activated. The at least one of the first SCR or the second SCR is activated when voltage between the gate and the cathode is at least 150 mV.

A static transfer switch to transfer an output load from a first power source to a second power source. The static transfer switch includes a first switching unit having a first pair of silicon controlled rectifiers (SCRs) arranged in an anti-parallel relationship. The static transfer switch also includes a second switching unit having a second pair of SCRs arranged in an anti-parallel relationship. At least one of the SCRs is activated when a voltage level of the at least one of the SCRs is at least 150 mV until direct current through the at least one of the SCRs is below a holding current level.

A static transfer switch includes a first switching unit having a first silicon controlled rectifier (SCR) and a second SCR arranged in an anti-parallel relationship. The static transfer switch also includes a second switching unit having a third SCR and a fourth SCR arranged in an anti-parallel relationship. A control circuit maintains one of the first SCR or second SCR in an activated state, wherein the control circuit activates one of the third SCR or fourth SCR, causing the one of the first SCR or second SCR to transition to a deactivated state via a reverse voltage, after which the other of the third SCR or fourth SCR may be activated. The control circuit determines that the one of the first SCR or second SCR and the one of the third SCR or fourth SCR is activated when the voltage between the gate and the cathode of the respective SCR is at least 150 mV.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

In accordance with an aspect of the present disclosure, a STS utilizes SCRs having the characteristic that voltage level between the gate and the cathode ($V_{GK}$) remains at a level of at least 150 mv until the direct current flowing through the SCR is below the holding current level and the SCR has switched off. SCR switch off detection in such an STS is accomplished by analyzing $V_{GK}$. When the $V_{GK}$ has dropped to below 150 mv, the SCR is determined to be off. It should be understood that not all SCRs exhibit the above characteristic of being off when the $V_{GK}$ has dropped to below 150 mv. The SCRs utilized in the STS in accordance with an aspect of the present disclosure are thus selected from SCRs having this characteristic, such as by testing SCRs and utilizing only those that exhibit this characteristic in the STS.

In an aspect, in the firing circuit for the SCR there is a simple hardware voltage comparator that provides an easy info/signal necessary for the correct switching management of the unit which is referred to herein as SCR ON. Each firing circuit for each SCR of the STS provides the SCR ON signal, which uses fast switching management when switching the STS between the two independent input power sources.

Figure 1:
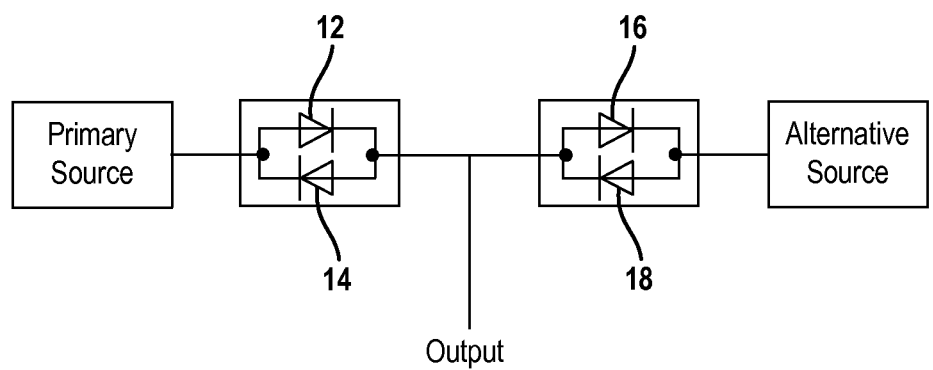
FIG. 1 is a circuit diagram of one phase of a static transfer switch.

FIG. 1 shows the basic architecture of a STS (one phase only for simplicity) having a double static switch module (one for each input source) in anti-parallel configuration.

The basic principles of an STS switching transfer management in accordance with an aspect of the present disclosure are: a) to perform a fast transfer of the output load from the active source to the alternative one (obviously if the alternative one is healthy) avoiding any kind of direct current between the two independent input sources of the STS (referred to herein as Break Before Make transfer of the STS (BBM)); b) the transfer is independent of the power factor (full range) of the load and the phase difference between the STS input sources; and c) the maximum transfer time after an active source fault doesn't exceed a quarter of a period (in a sinusoidal regime). The foregoing can be achieved on the basis of the following transfer management in switching the STS from the active source to the alternative source: Every time the STS needs to transfer from the active source to the alternative source, the control logic that controls the STS switches off the firing circuits of SCRs for the active source and switches ON the SCR firing circuits for the alternative source and the BBM feature of this transfer is achieved by the SCR switch off hardware detection described above in accordance with the following switching transfer management.

Transfer From Primary Source to Alternative Source

With reference to FIG. 1, in the case where SCR "A" 12 is still in conduction, the SCR ON signal of SCR "A" 12 is still active and the control logic thus maintains inhibited the sole SCR "C" 16, but leaving the SCR "D" 18 free to switch ON in order to force the switching OFF of SCR "A" 12 by providing a reverse voltage for a short period of time. In case where SCR "B" 14 is still in conduction, the SCR ON signal of SCR "B" 14 is still active and the control logic thus maintains inhibited the sole SCR "D" 18, but leaving the SCR "C" 16 free to switch ON in order to force the switching OFF of SCR "B" 14 by providing a reverse voltage for a short period of time. Once SCR "A" 12 and SCR "B" 14 have switched off, their SCR ON signals are inactive and SCR "C" 16, SCR "D" 18 are completely free to operate.

Transfer from Alternative Source to Primary Source

In the case where SCR "D" 18 is still in conduction, the SCR ON signal of SCR "D" 18 is still active and this will maintain inhibited the sole SCR "B" 14, but leaving the SCR "A" 12 free to switch ON in order to force the switching OFF of SCR "D" 18 by providing a reverse voltage for a short period of time. In the case where SCR "C" 16 is still in conduction, the SCR ON signal of SCR "C" 16 is still active and this will maintain inhibited the sole SCR "A" 12, but leaving the SCR "B" 14 free to switch ON in order to force the switching OFF of SCR "C" 16 by providing a reverse voltage for a short period of time. Once SCR "C" 16 and SCR "D" 18 have switched off, their SCR ON signals are inactive and SCR "A" 12, SCR "B" 14 are completely free to operate.

Figure 2A:
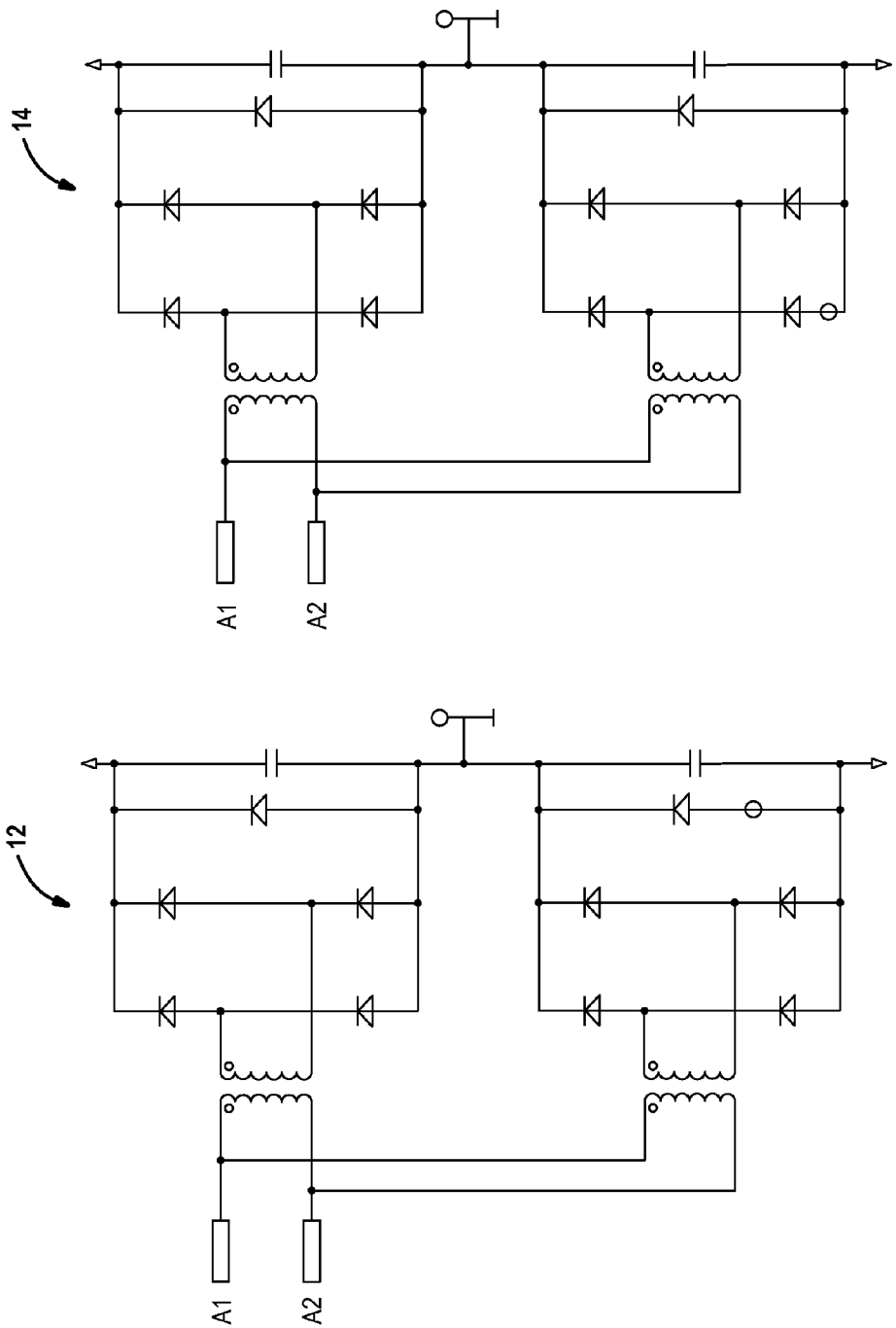
FIGS. 2A-2D are schematics of a circuit for control logic implementing the transfer between primary and alternative sources for SCRs "A" and "B"
Figure 2B:
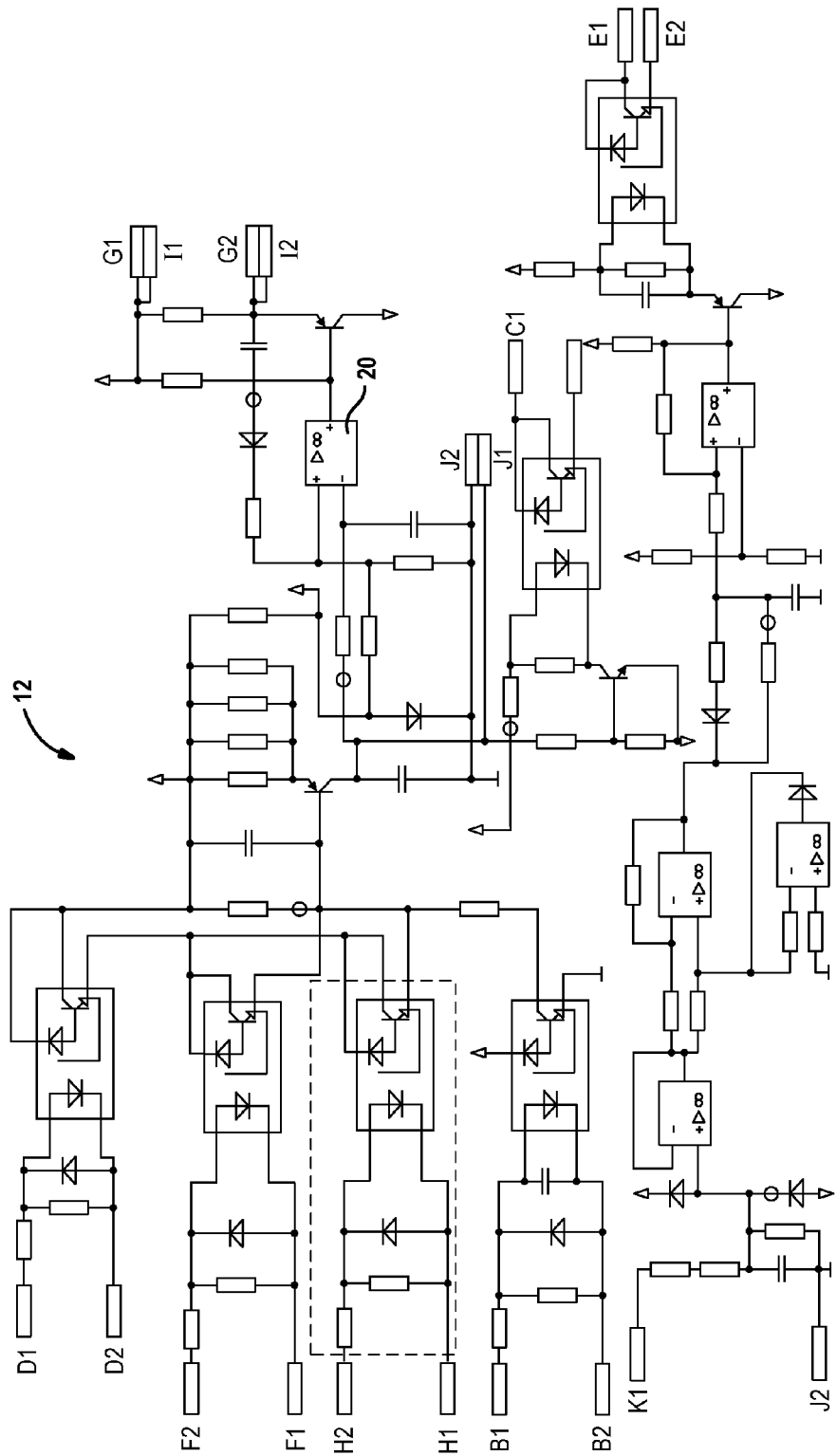
Figure 2C:
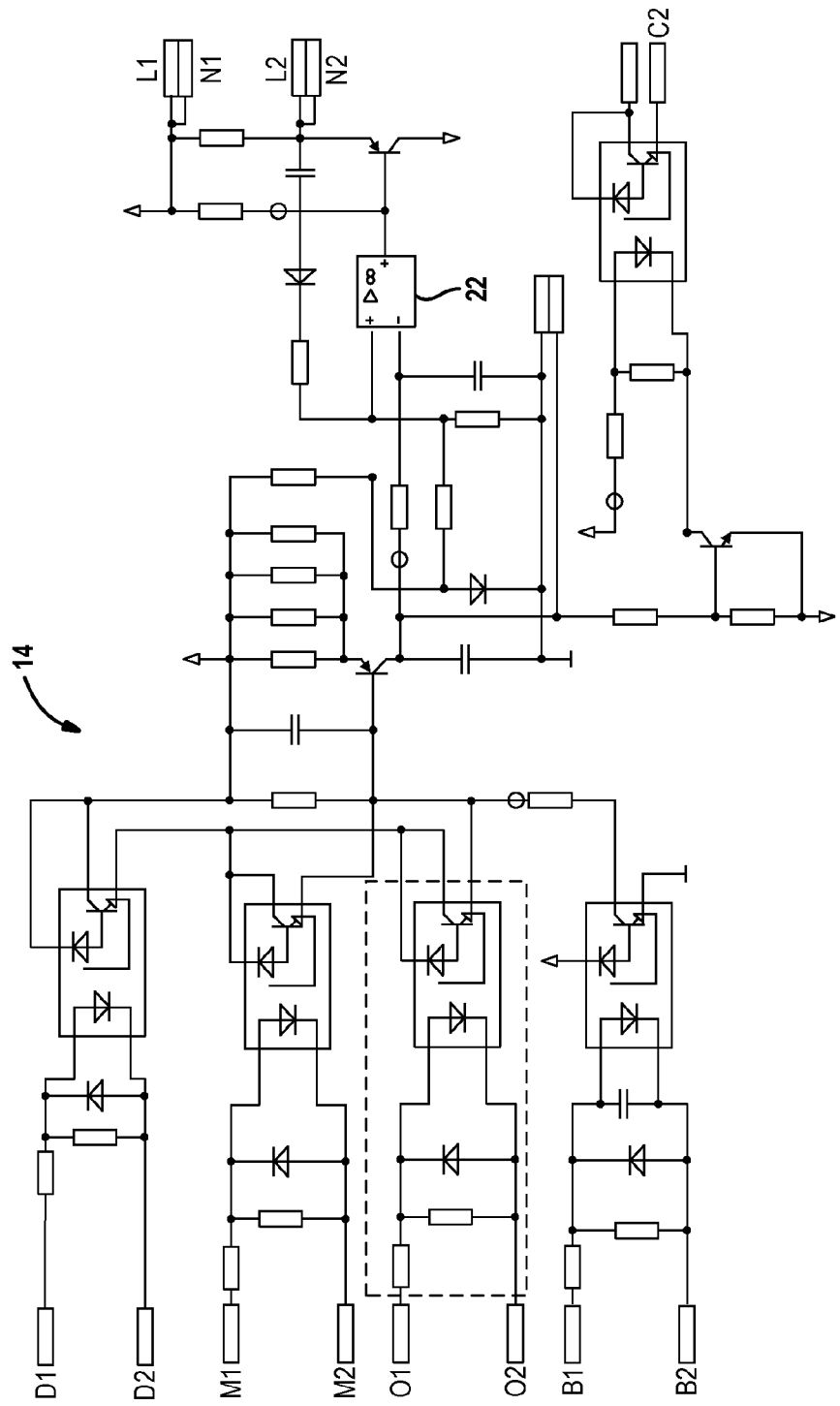
Figure 2D:
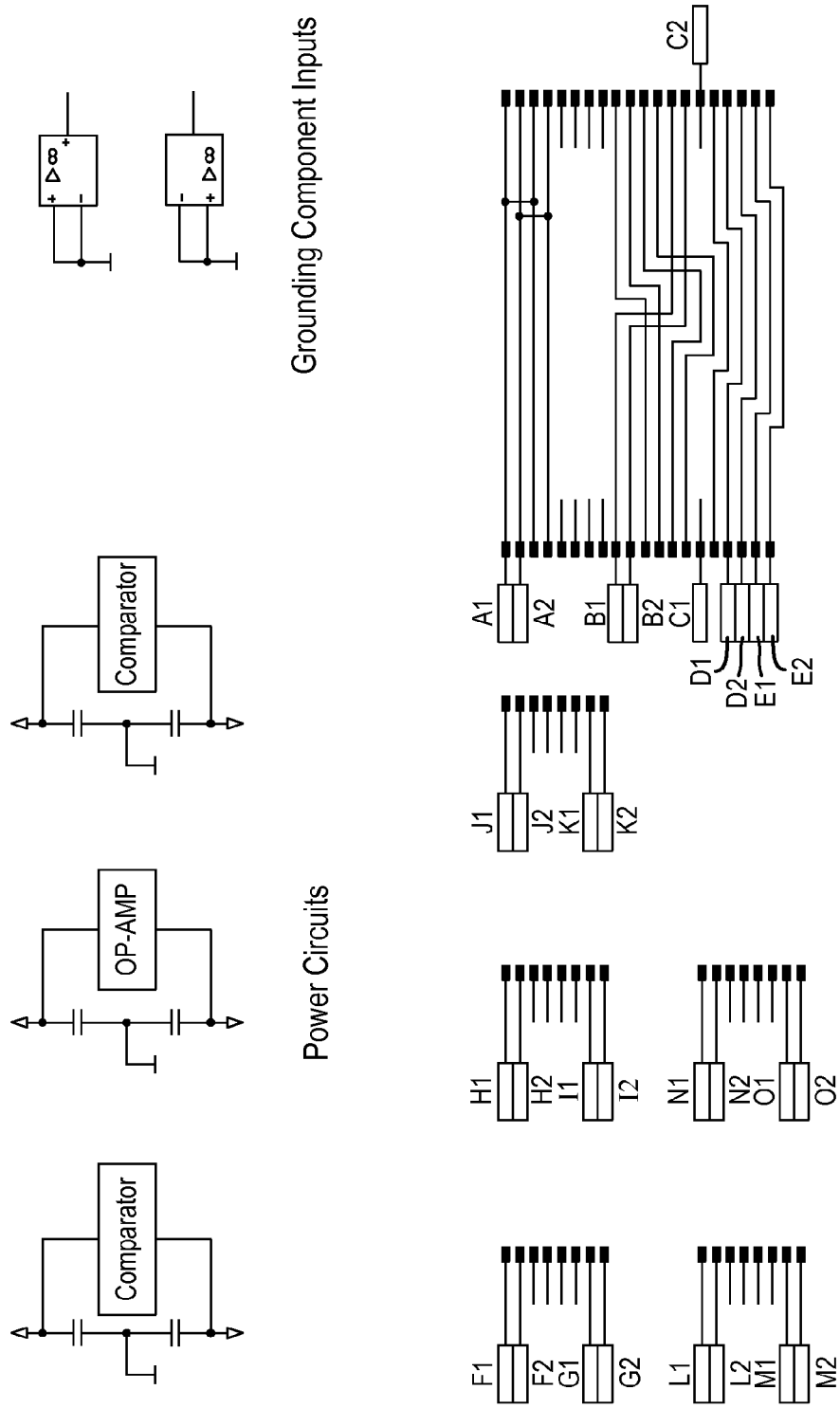

FIGS. 2A-2D are a schematic of a circuit for control logic implementing the foregoing for SCRs "A" 12 and "B" 14. FIG. 2B includes the comparator circuit 20 that provides the SCR ON signal for SCR "A" 12 and FIG. 2C includes the comparator circuit 22 that provides the SCR ON signal for SCR "B" 14. The output of the comparators 20, 22 are used to inhibit the SCR gate command (firing) circuits SCR section as above described (FIGS. 2B-2C). The circuit provides control of up to two paralleled SCR modules (e.g. SCR A in parallel with SCR A', B-B', C-C', D-D'). It should be understood that this circuit is an example of control logic implementing the foregoing and other circuits can be used, such as Application Specific Integrated Circuits (ASICS), and the control logic could also be implemented in programmable devices, such as microcontrollers and digital signal processors (DSPs).

Figure 3:
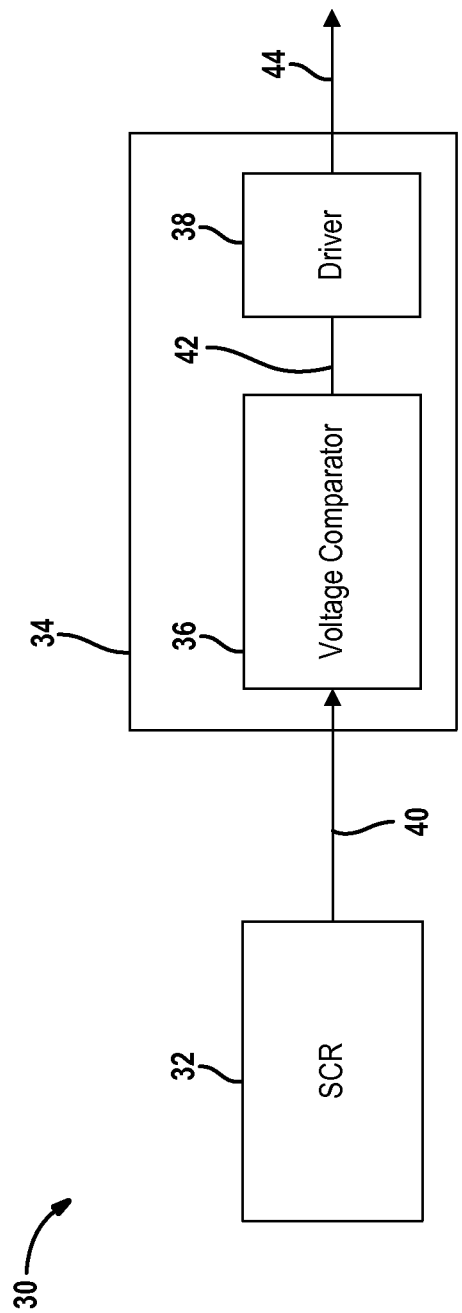
FIG. 3 is a functional block diagram of a circuit for implementing a portion of static transfer switch management system.

FIG. 3 is a functional block diagram illustrating a portion of a static transfer switch management system 30. The static transfer switch management system 30 includes a SCR 32 and a SCR control circuit 34. The SCR control circuit 34 includes a voltage comparator 36 and a driver 38. SCR 32 outputs a monitoring signal 40 received by comparator 36 of control circuit 34. Monitoring signal 40 varies in accordance with the voltage between the gate and the cathode of SCR 32. In various embodiments, if the voltage between the gate and the cathode is greater than 150 mV, SCR 32 is determined to be active (ON status). Comparator 36 compares the monitoring signal 40 to a reference voltage to determine whether the SCR 32 is activated. Voltage comparator 36 outputs a status signal 42 to driver 38. Driver 38 in outputs an activation signal 44 in accordance with status signal 42.

It should be understood that the above described transfer management is able to perform a BBM transfer also in extreme working conditions with DC current components summed to the load current. Moreover, the foregoing SCR off detection can be applied not only for STS applications, but everywhere an SCR off detection is required.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A static transfer switch to transfer an output load from a first power source to a second power source, the static transfer switch comprising:
   a first switching unit having a first silicon controlled rectifier (SCR);
   a second switching unit having a second SCR; and
   a control circuit configured to determine whether at least one of the first SCR or the second SCR is inactive, wherein the at least one of the first SCR or the second SCR is inactive when voltage between a gate and a cathode of the at least one SCR falls below 150 mV and a direct current between an anode and a cathode of the at least one SCR falls below a holding current, and the control circuit is further configured so that when the voltage between the gate and the cathode of the at least one SCR is greater than 150 mV or the direct current between the anode and the cathode of the at least one SCR remains above the holding current, the at least one SCR is active.

2. The static transfer switch of claim 1 wherein the first SCR communicates with a first firing circuit and the second SCR communicates with a second firing circuit.

3. The static transfer switch of claim 1 wherein the control circuit outputs a status signal in accordance with activation of the at least one of the first or the second SCR.

4. A static transfer switch to transfer an output load from a first power source to a second power source, the static transfer switch comprising:
   a first switching unit having a first pair of silicon controlled rectifiers (SCRs) arranged in an anti-parallel relationship;
   a second switching unit having a second pair of SCRs arranged in an anti-parallel relationship; and
   a control circuit configured to determine whether at least one of the SCRs is inactive when a voltage level between a gate and a cathode of the at least one of the SCRs falls below 150 mV and a direct current between an anode and a cathode of the at least one SCR falls below a holding current, and the control circuit is further configured so that when the voltage between the gate and the cathode of the at least one SCR is greater than 150 mV or the direct current between the anode and the cathode of the at least one SCR remains above the holding current, the at least one SCR is active.

5. The static transfer switch of claim 4 further comprising a control circuit communicating with the at least one of the SCRs, the control circuit determining whether the at least one of the SCRs is active and generating an output signal in accordance with activation of the at least one of the SCRs.

6. The static transfer switch of claim 5 wherein the control circuit outputs a control signal to activate at least one of the SCRs.

7. A static transfer switch, comprising:
   a first switching unit having a first silicon controlled rectifier (SCR) and a second SCR arranged in an anti-parallel relationship;
   a second switching unit having a third SCR and a fourth SCR arranged in an anti-parallel relationship; and
   a control circuit, the control circuit configured to maintain one of the first SCR or second SCR in an active state, wherein the control circuit activates one of the third SCR or fourth SCR, causing the one of the first SCR or second SCR to transition to a not active state via a reverse voltage, after which the other of the third SCR or fourth SCR may be active,
   wherein the control circuit is configured to determine whether the one of the first SCR or second SCR and the one of the third SCR or fourth SCR is inactive when the voltage between a gate and a cathode of the respective SCR falls below at least 150 mV and a direct current between an anode and a cathode of the one of the first SCR or second SCR and the one of the third SCR or fourth SCR falls below a holding current, and the control circuit is further configured so that when the voltage between the gate and the cathode is greater than 15 mV or the direct current between the anode and the cathode of the one of the first SCR or second SCR and the one of the third SCR or fourth SCR remains above the holding current, the SCR is determined to be active.

8. The static transfer switch of claim 7 wherein the first switching unit is configured to communicate with a first firing circuit and the second switching unit communicates with a third firing circuit.

9. The static transfer switch of claim 7 wherein the first switching unit communicates with a second firing circuit and the second switching unit communicates with a fourth firing circuit, wherein the first, second, third, and fourth SCRs communicate with a respective first, second, third, and fourth firing circuit.

* * * * *